(12) United States Patent
Khlat

(10) Patent No.: US 11,387,801 B1
(45) Date of Patent: Jul. 12, 2022

(54) ADJUSTABLE REJECTION CIRCUIT WITH TUNABLE IMPEDANCE

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 17/217,098

(22) Filed: Mar. 30, 2021

Related U.S. Application Data

(60) Provisional application No. 63/137,189, filed on Jan. 14, 2021.

(51) Int. Cl.
| | |
|---|---|
| *H04B 1/40* | (2015.01) |
| *H03H 7/38* | (2006.01) |
| *H03H 7/01* | (2006.01) |
| *H03H 7/00* | (2006.01) |

(52) U.S. Cl.
CPC ............ *H03H 7/38* (2013.01); *H03H 7/0115* (2013.01); *H04B 1/40* (2013.01); *H03H 2007/006* (2013.01)

(58) Field of Classification Search
CPC .......... H04B 1/0458; H04B 3/16; H04B 1/40; H03H 7/38; H03H 7/383; H03H 9/0004; H03H 7/0115
See application file for complete search history.

(56) References Cited

U.S. PATENT DOCUMENTS

2013/0009722 A1* 1/2013 White ............... H03H 7/40
333/32

* cited by examiner

*Primary Examiner* — Tuan Pham
(74) *Attorney, Agent, or Firm* — Withrow & Terranova, P.L.L.C.

(57) ABSTRACT

An adjustable rejection circuit with tunable impedance circuit is disclosed. In particular, a circuit is provided with an impedance tuner configured to match impedances for an antenna. The impedance tuner may include an LC circuit (inductor-capacitor circuit) with one or more elements of the LC circuit being variable. An adjustable rejection circuit may be placed in parallel with the impedance tuner. The adjustable rejection circuit may include a variable negative capacitance element that provides strong attenuation in frequencies of interest.

14 Claims, 21 Drawing Sheets

US 11,387,801 B1

ADJUSTABLE REJECTION CIRCUIT WITH TUNABLE IMPEDANCE

RELATED APPLICATIONS

This application claims the benefit of U.S. provisional patent application Ser. No. 63/137,189, filed Jan. 14, 2021, the disclosure of which is hereby incorporated herein by reference in its entirety.

FIELD OF THE DISCLOSURE

The technology of the disclosure relates generally to controlling impedance associated with transmission paths to antennas in wireless communication devices.

BACKGROUND

Mobile communication devices have become increasingly common in current society. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The redefined user experience requires higher data rates offered by wireless communication technologies, such as Wi-Fi, long-term evolution (LTE), and fifth-generation new-radio (5G-NR). 5G-NR, in particular, relies on multiple input-multiple output (MIMO) techniques to enable high-bandwidth communication where plural antennas may transmit multiple signals that have been shaped or steered by a beamforming circuit that adjusts relative phases of the signals.

Typical beamforming circuits assume relatively constant impedance at the antennas. However, temperature fluctuations or other environmental changes (e.g., how a user holds the phone in hand, near body, or on a table with speaker phone on) in the circuitry or at the antenna may cause changes of impedance outside the assumed constant impedance tolerances, resulting in variations in the beam steering which may negatively impact performance.

SUMMARY

Aspects disclosed in the detailed description include an adjustable rejection circuit with tunable impedance. In an exemplary aspect, a circuit is provided with an impedance tuner configured to match impedances for an antenna. The impedance tuner may include an LC circuit (inductor-capacitor circuit) with one or more elements of the LC circuit being variable. An adjustable rejection circuit may be placed in parallel with the impedance tuner. In an exemplary aspect, the adjustable rejection circuit may include a variable negative capacitance element that provides strong attenuation in frequencies of interest. By providing the impedance tuner and adjustable rejection circuit within a single circuit, overall performance may be improved without expanding the footprint of the device excessively.

In one aspect, a circuit is disclosed. The circuit comprises an input. The circuit also comprises an output. The circuit also comprises an impedance tuner. The impedance tuner comprises a first variable capacitor having a first end and a second end. The first variable capacitor is serially positioned between the input and the output. The impedance tuner also comprises a second variable capacitor coupled to a first node formed by the second end of the first variable capacitor and the output. The second variable capacitor is also coupled to a ground. The circuit also comprises an adjustable rejection circuit. The adjustable rejection circuit comprises a variable negative capacitance circuit electrically parallel to the first variable capacitor.

In another aspect, a circuit is disclosed. The circuit comprises an input. The circuit also comprises an output. The circuit also comprises an impedance tuner. The impedance tuner comprises a first inductor coupled to the input. The impedance tuner also comprises a second inductor serially negatively coupled to the input and the output. The impedance tuner also comprises a first variable capacitor coupled to an intermediate node between the first inductor and the second inductor and also coupled to a ground. The impedance tuner also comprises a second variable capacitor coupled to the output. The circuit also comprises an adjustable rejection circuit. The adjustable rejection circuit comprises a variable negative capacitance circuit electrically parallel to the impedance tuner.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure and, together with the description, serve to explain the principles of the disclosure.

DETAILED DESCRIPTION

Figure 1A:
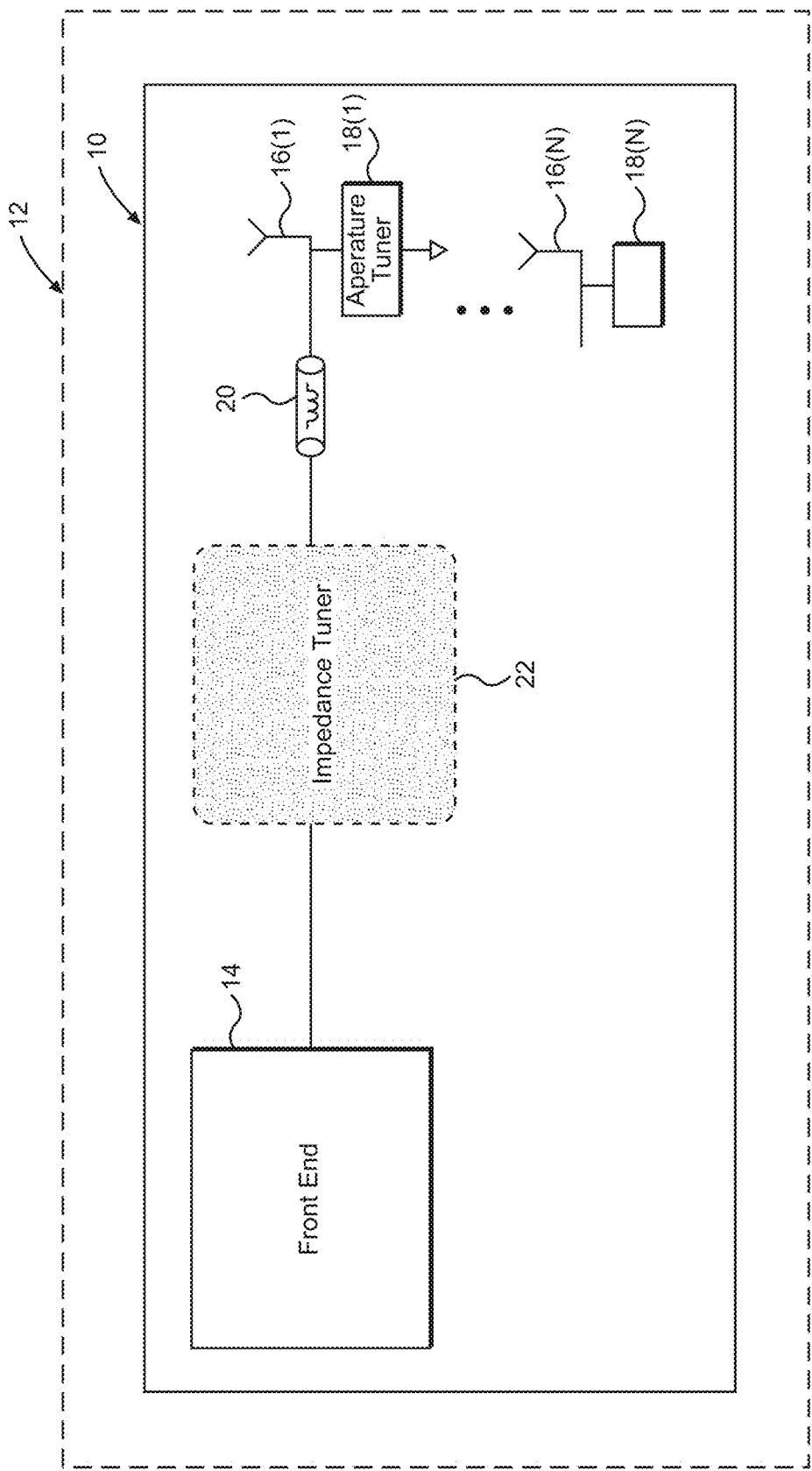
FIG. 1A is a block diagram of a conventional impedance tuner positioned between a front end circuit and an antenna.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include an adjustable rejection circuit with tunable impedance. In an exemplary aspect, a circuit is provided with an impedance tuner configured to match impedances for an antenna. The impedance tuner may include an LC circuit (inductor-capacitor circuit) with one or more elements of the LC circuit being variable. An adjustable rejection circuit may be placed in parallel with the impedance tuner. In an exemplary aspect, the adjustable rejection circuit may include a variable negative capacitance element that provides strong attenuation in frequencies of interest. By providing the impedance tuner and adjustable rejection circuit within a single circuit, overall performance may be improved without expanding the footprint of the device excessively.

Figure 1B:
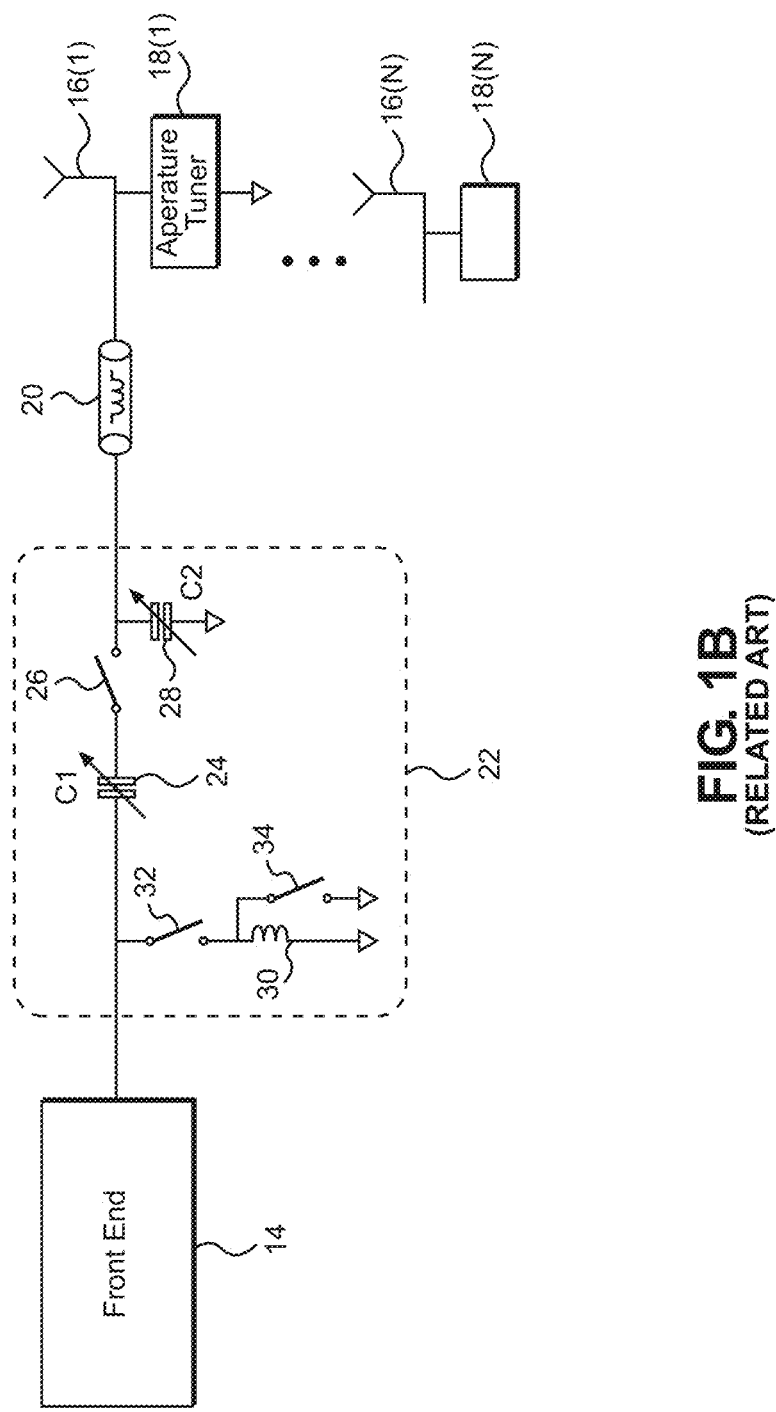
FIG. 1B is a circuit diagram of the impedance tuner of FIG. 1A.
Figure 2:
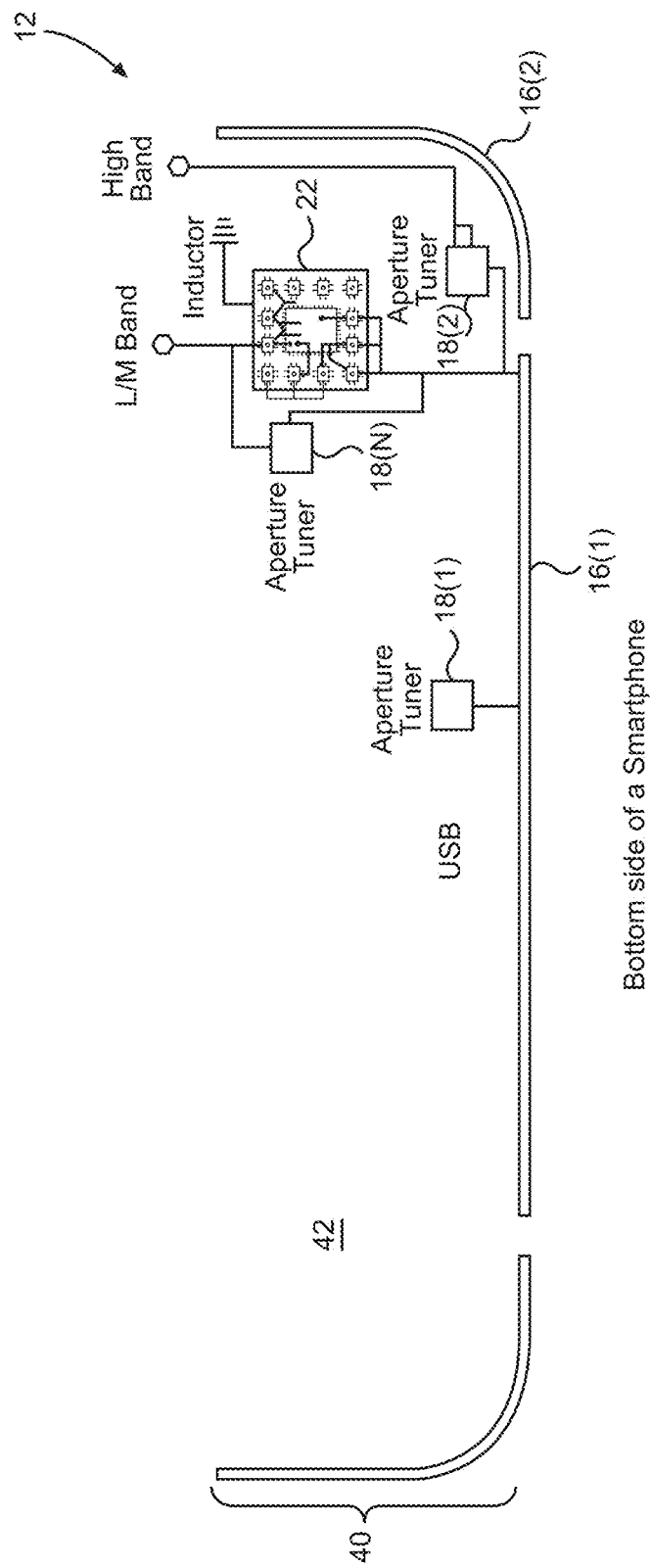
FIG. 2 is a partial view of a mobile communication device showing relative positions of aperture tuners, an impedance tuner, and antennas.

Before addressing exemplary aspects of the present disclosure, a brief overview of conventional impedance tuners and their role in a mobile communication device are provided with reference to FIGS. 1A-2. A discussion of exemplary aspects of the present disclosure are provided below beginning with reference to FIG. 3.

In this regard, FIG. 1A illustrates a block diagram of a transmission chain 10 in a mobile communication device 12. The transmission chain 10 may include a front end circuit 14, which may be a radio frequency front end (RFFE) circuit included in a switch power amplifier duplexer (SPAD) module or the like. The front end circuit 14 conditions signals for transmission by one or more antennas 16(1)-16(N). Each antenna 16(1)-16(N) may have a respective aperture tuner circuit 18(1)-18(N). The front end circuit 14 may be connected to the antennas 16(1)-16(N) through a flexible connector 20, which may be, for example, a form of coaxial cable. In an exemplary aspect, each antenna 16(1)-16(N) may have a respective connector 20, although only one is shown. Because it is known that the impedance of the antennas 16(1)-16(N) may change, aperture tuner circuits 18(1)-18(N) and an impedance tuner 22 may be provided to adjust impedances presented by the antennas 16(1)-16(N) so as to reduce reflections and improve performance.

FIG. 1B provides the circuit details of a typical impedance tuner 22, which may include a first variable capacitor 24, a switch 26, and a second variable capacitor 28. An inductor 30 may be selectively added or shorted to ground by switches 32 and 34. Other impedance tuners do exist, but the circuit illustrated in FIG. 1B is typical.

FIG. 2 shows a partial view of the mobile communication device 12 and particularly a bottom portion 40 of a chassis 42 of the mobile communication device 12. The impedance tuner 22 is placed proximate the antennas 16(1)-16(N) and may be used by all of them. Respective aperture tuner circuits 18(1)-18(N) are closer to the antennas 16(1)-16(N). Other configurations may be used by different mobile communication devices, but in general, the antennas 16(1)-16(N) are integrated into various positions within the chassis 42 and not part of the motherboard or printed circuit board (PCB) within the mobile communication device 12.

While the impedance tuner 22 may be effective at reducing unwanted reflections and allowing impedance matching, other concerns do exist. For example, antennas by design capture signals and translate them into electrical signals. In general, the antenna does not discriminate between signals of interest and other signals. When the antenna captures signals outside the signals of interest, these additional signals may show up as noise and negatively impact performance or the user experience. Even when the antennas only capture signals of interest, ringing or harmonics of those signals may exist within the circuitry of the mobile communication device, which may also negatively impact performance or the user experience. Band pass filters and the like may be used to limit unwanted signals, but there is room for improvement in providing signal rejection at unwanted frequencies.

Exemplary aspects of the present disclosure reuse some of the elements of the impedance tuner and co-locate an adjustable rejection circuit with the impedance tuner. By reusing the elements of the impedance tuner, the overall footprint of the combined device is not increased excessively. Likewise, because the impedance tuner already serves all the antennas, duplicative circuits (e.g., like the aperture tuners) are not required for each antenna.

Figure 3A:
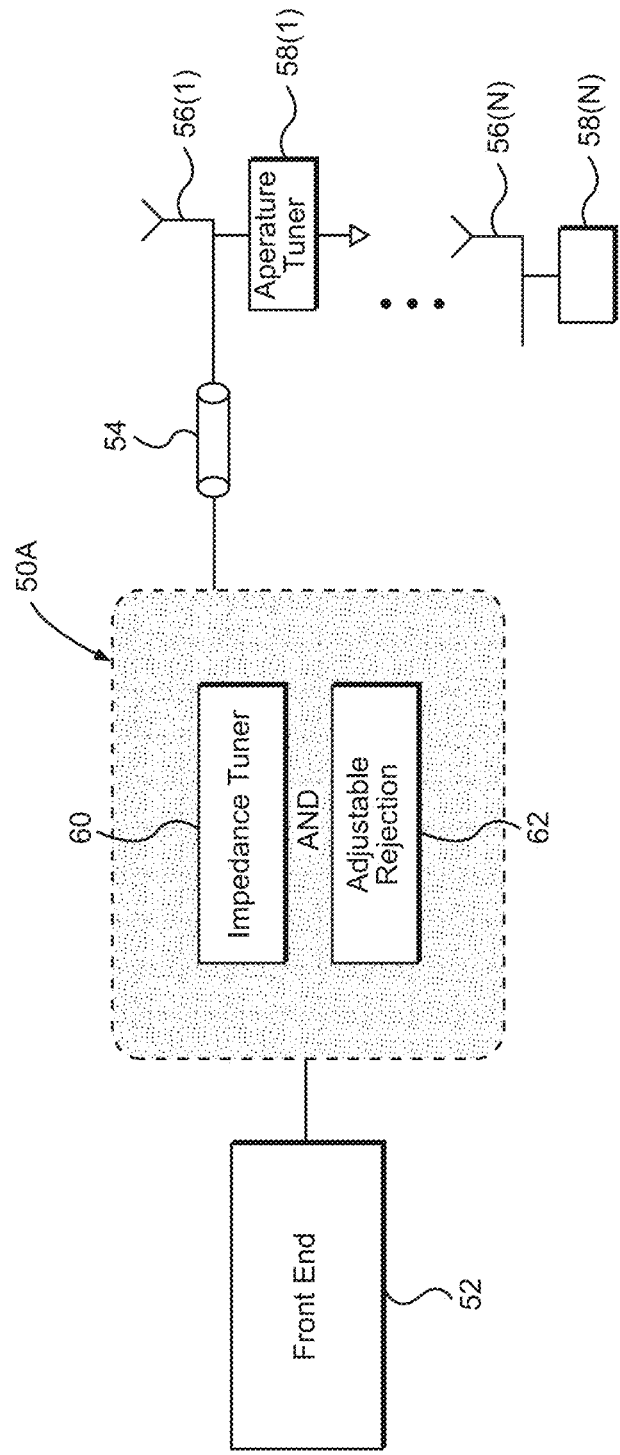
FIG. 3A is a block diagram of a combined impedance tuner and adjustable rejection circuit capable of operating as both concurrently positioned between a front end circuit and an antenna.
Figure 3B:
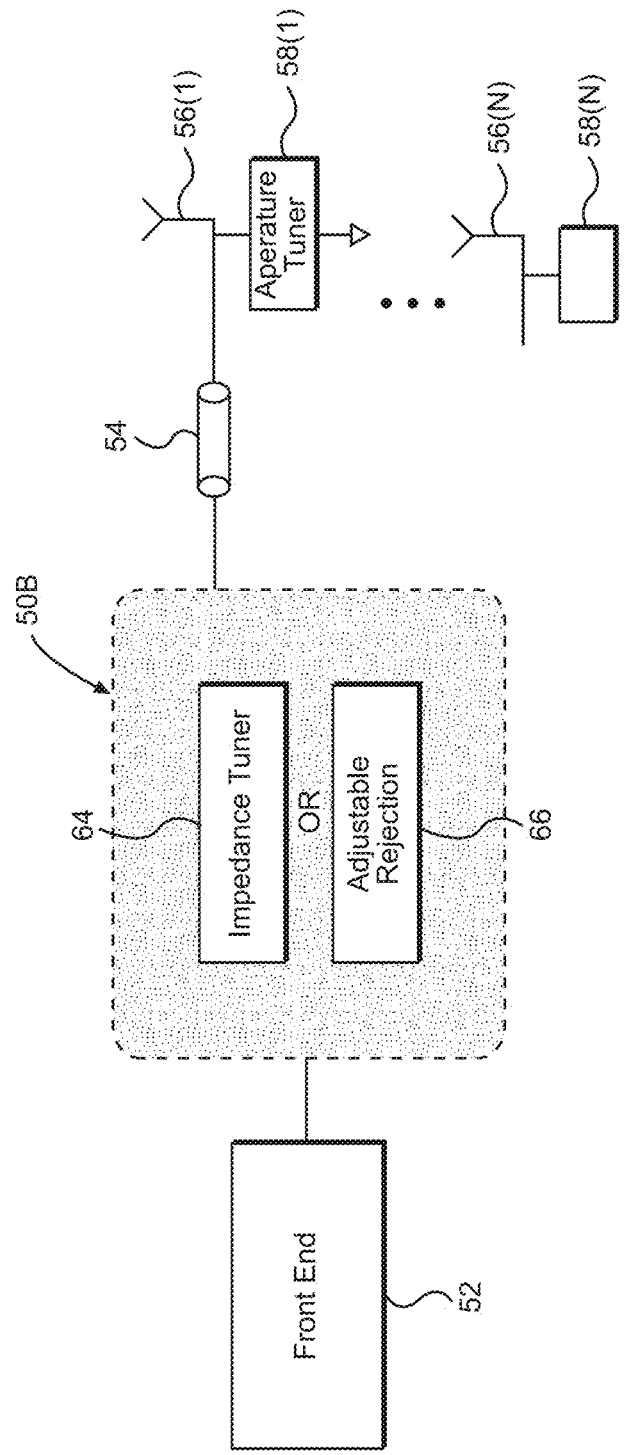
FIG. 3B is a block diagram of a combined impedance tuner and adjustable rejection circuit capable of operating as one or the other modalities positioned between a front end circuit and an antenna.

While the exemplary aspects discussed below primarily focus on an adjustable rejection circuit that operates concurrently with the impedance tuner, the present disclosure is not so limited, and the combined circuit may operate in one mode or another mode. These two possibilities are illustrated in FIGS. 3A and 3B, respectively. For example, FIG. 3A illustrates a combined circuit 50A that sits between a front end 52 and a connector 54. The connector 54 may be connected to antennas 56(1)-56(N), each having a respective aperture tuner 58(1)-58(N). The combined circuit 50A includes an impedance tuner 60 and an adjustable rejection circuit 62 that work concurrently.

In contrast, FIG. 3B illustrates a combined circuit 50B where either an impedance tuner 64 or an adjustable rejection circuit 66 works, but not both concurrently. Such mode switching may be done with switches (not shown) as needed or desired. Individual elements may still be reused, but the functionality is limited to just a single mode.

Figure 4:
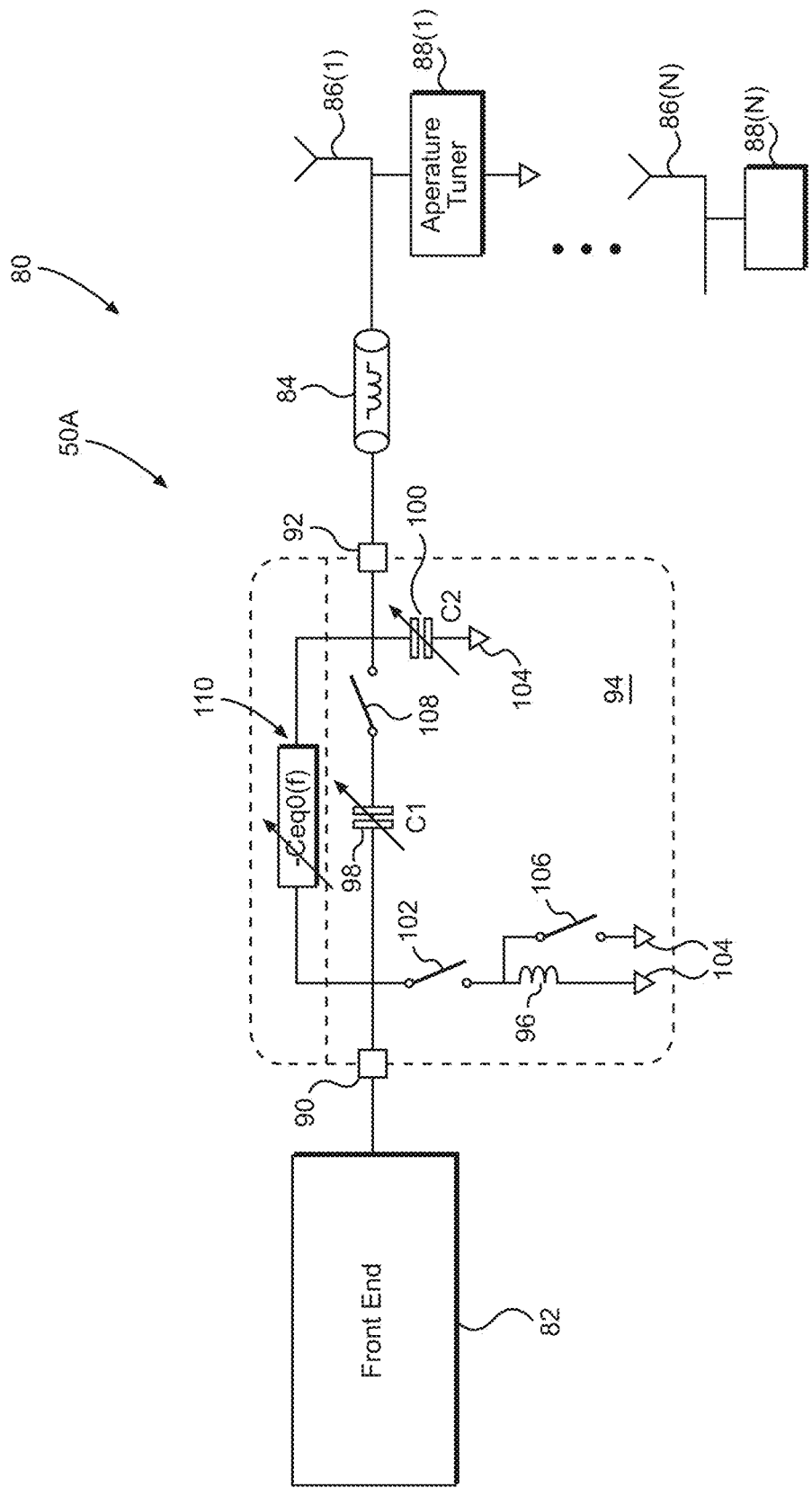
FIG. 4 is a circuit diagram of a combined impedance tuner and adjustable rejection circuit with a variable negative capacitance used to provide the adjustable rejection portion of the circuit.

Assuming an impedance tuner similar to the impedance tuner 22 of FIG. 2, FIG. 4 provides an exemplary circuit diagram of the combined circuit 50A within a mobile communication device 80. In particular, the mobile communication device 80 includes a front end 82, the combined circuit 50A, a connector 84, antennas 86(1)-86(N), and aperture tuners 88(1)-88(N). The combined circuit 50A includes an input 90 and an output 92.

The combined circuit 50A further includes an impedance matching circuit 94 that may include an inductor 96, a first variable capacitor 98, and a second variable capacitor 100. The inductor 96 may be connected to the input 90 via a switch 102. The inductor 96 may further be connected to a ground 104. The input 90 is also connected to the ground 104 via a switch 106. The second variable capacitor 100 is also connected to ground 104. The first variable capacitor 98 is connected to the output 92 through a switch 108.

The combined circuit 50A further includes an adjustable rejection circuit 110, which may be a frequency dependent variable negative capacitance circuit (e.g., $-Ceq0(f)$). While various structures can be used to create the variable negative capacitance circuit, one exemplary structure is a network made of two negatively coupled inductors with a middle node using a tunable shunt capacitor to ground as better illustrated in FIG. 5.

Figure 5:
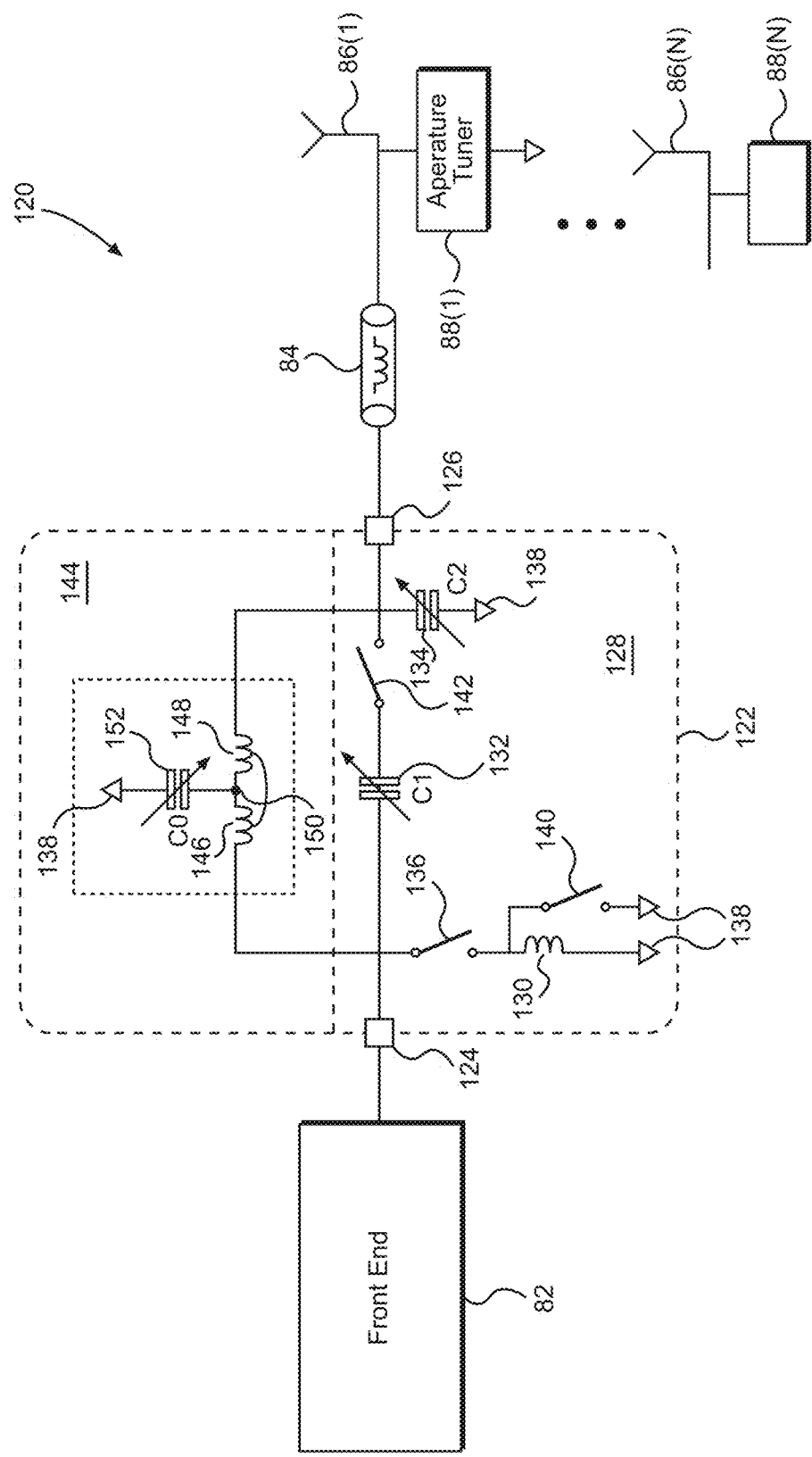
FIG. 5 is a circuit diagram of an exemplary aspect of the combined impedance tuner and adjustable rejection circuit with negatively coupled inductors and a shunt capacitor acting as the negative capacitance element from FIG. 4.

In particular, FIG. 5 illustrates a mobile communication device 120 that includes a front end 82, a connector 84, antennas 86(1)-86(N), and aperture tuners 88(1)-88(N). The mobile communication device 120 further includes a combined circuit 122. The combined circuit 122 includes an input 124 and an output 126. The combined circuit 122 further includes an impedance matching circuit 128 that may include an inductor 130, a first variable capacitor 132 (C1), and a second variable capacitor 134 (C2). The inductor 130 may be connected to the input 124 via a switch 136. The inductor 130 may further be connected to a ground 138. The input 124 is also connected to the ground 138 via a switch 140. The second variable capacitor 134 is also connected to ground 138. The first variable capacitor 132 is connected to the output 126 through a switch 142.

With continued reference to FIG. 5, the combined circuit 122 also includes an adjustable rejection circuit 144. The adjustable rejection circuit 144 includes a first inductor 146 and a second inductor 148 serially connected to one another with an intermediate node 150. It should further be appreciated that the first inductor 146 and the second inductor 148 are negatively coupled. A variable capacitor 152 (−C0) is connected to the intermediate node 150 and to the ground 138.

Figure 6:
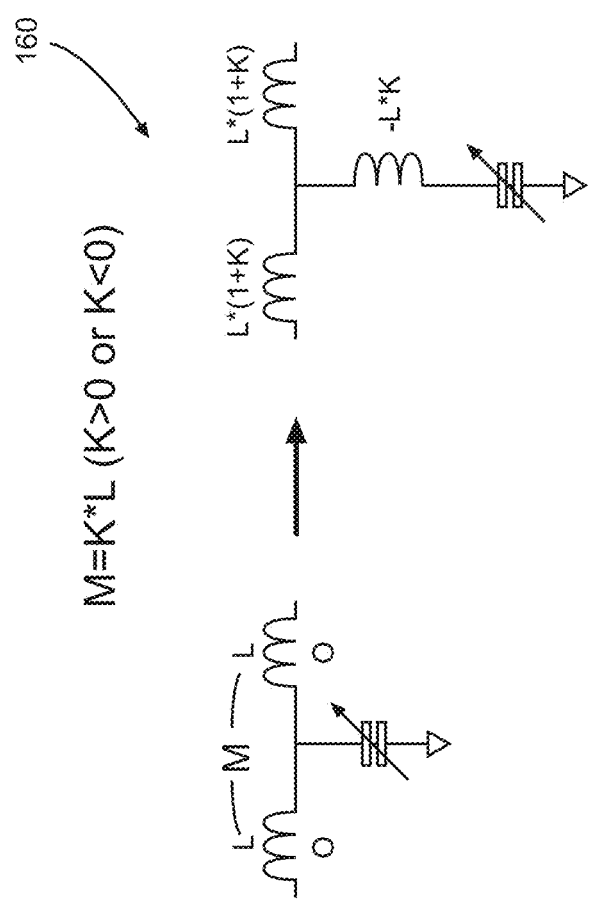
FIG. 6 is a diagram showing an equivalent network of two negatively coupled inductors (K>0)
Figure 7A:
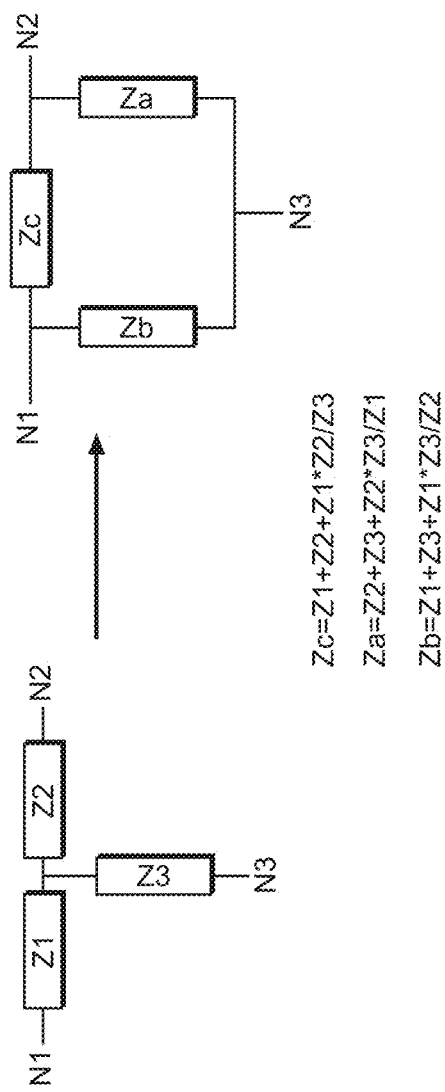
FIGS. 7A and 7B are diagrams showing a T to π transformation and indicating that an equivalent negative capacitance is obtained.
Figure 7B:
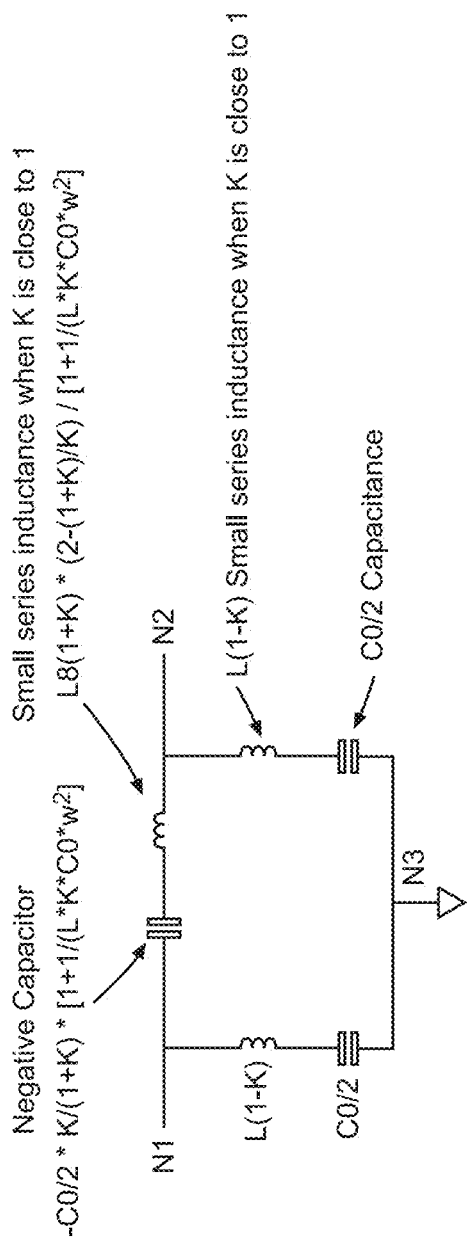

The efficaciousness of the adjustable rejection circuit 144 of FIG. 5 may be mathematically proven. Specifically, the two negatively coupled inductors 146, 148 may have a K factor (K>0) and thus would have an equivalent T-network 160, as shown in FIG. 6. If a T to π transformation is applied, the network between the two ports of the inductors has a behavior like a negative capacitor within a specific frequency range. Thus, if a T to π transformation is applied to the network, an equivalent electrical network is obtained that has a negative capacitance between the two terminals N1/N2, as shown in FIGS. 7A and 7B.

Figure 8:
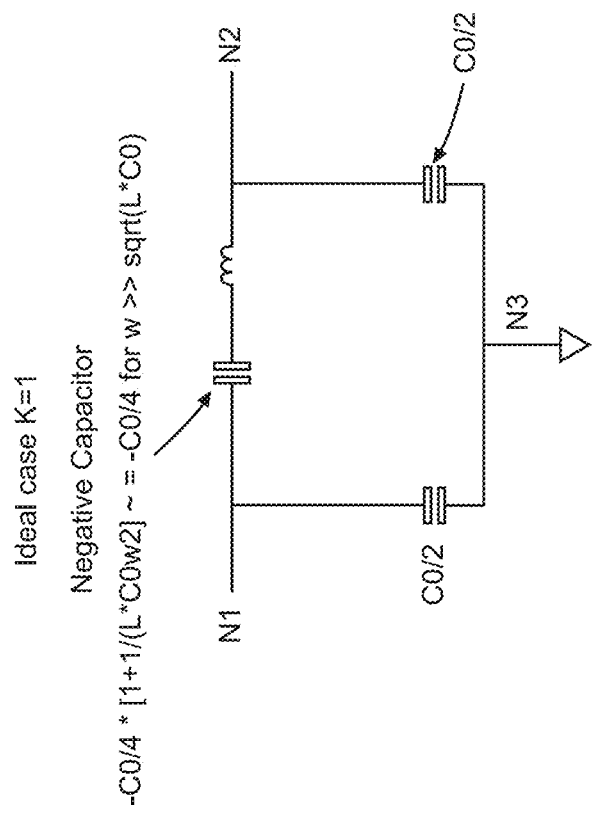
FIG. 8 is diagram showing ideal negative capacitance in the case K=1 and for frequencies above $1/\sqrt{(LC)}/(2*\pi)$.

For the case of ideal coupling, K=1, and for a frequency range above the resonance pulsation of $1/\sqrt{L*C0}$, an ideal negative capacitance of C0/4 is obtained, as shown in FIG. 8.

Figure 9:
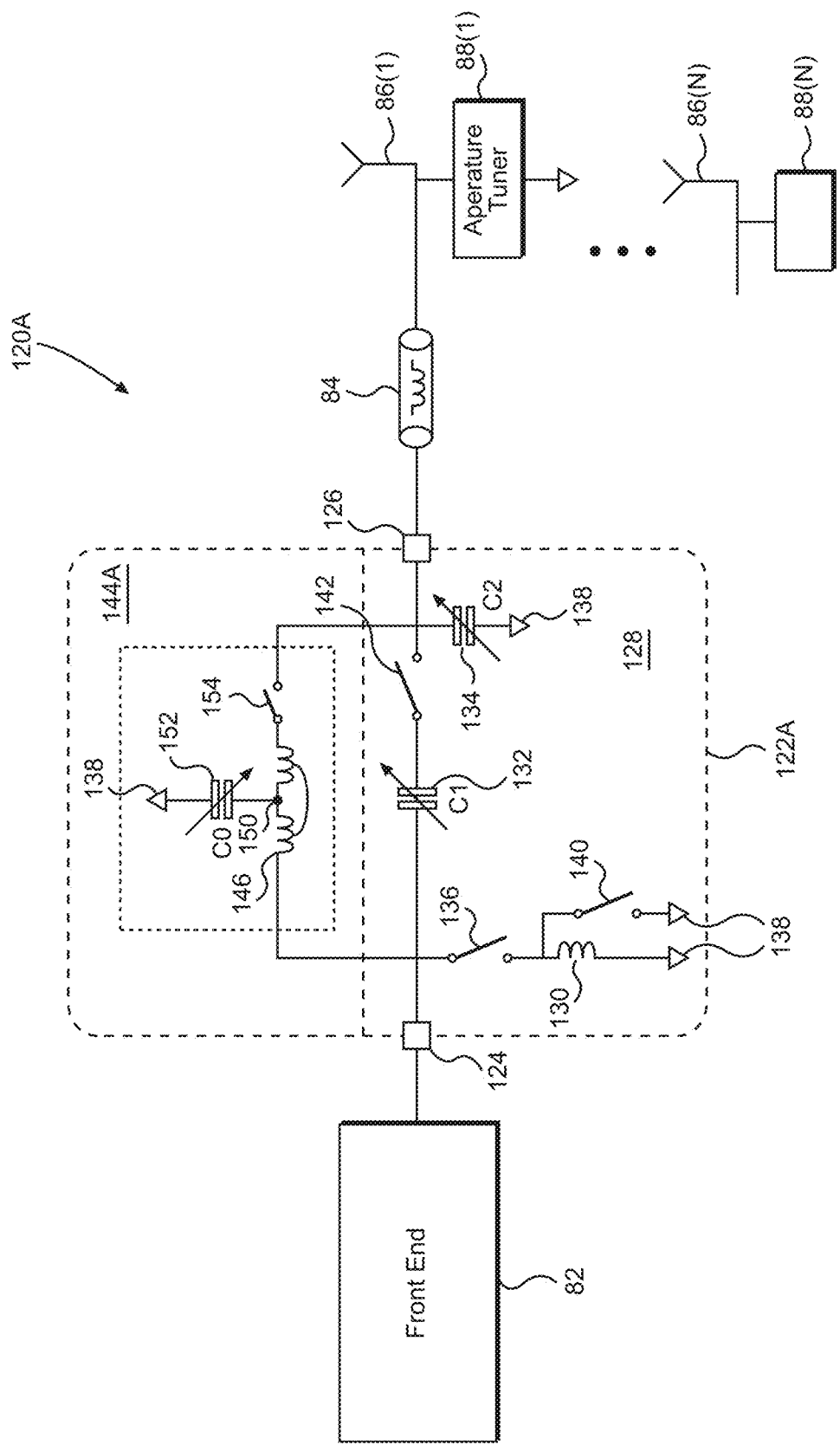
FIG. 9 is a circuit diagram of the combined impedance tuner and adjustable rejection circuit with an additional switch to disconnect the adjustable rejection circuit.

FIG. 9 illustrates a mobile communication device 120A that includes a front end 82, a connector 84, antennas 86(1)-86(N), and aperture tuners 88(1)-88(N). The mobile communication device 120A further includes a combined circuit 122A. The primary difference between the combined circuit 122A and the combined circuit 122 of FIG. 5 is a modified adjustable rejection circuit 144A, which includes a switch 154 that allows the adjustable rejection circuit 144A to be selectively used.

Figure 10:
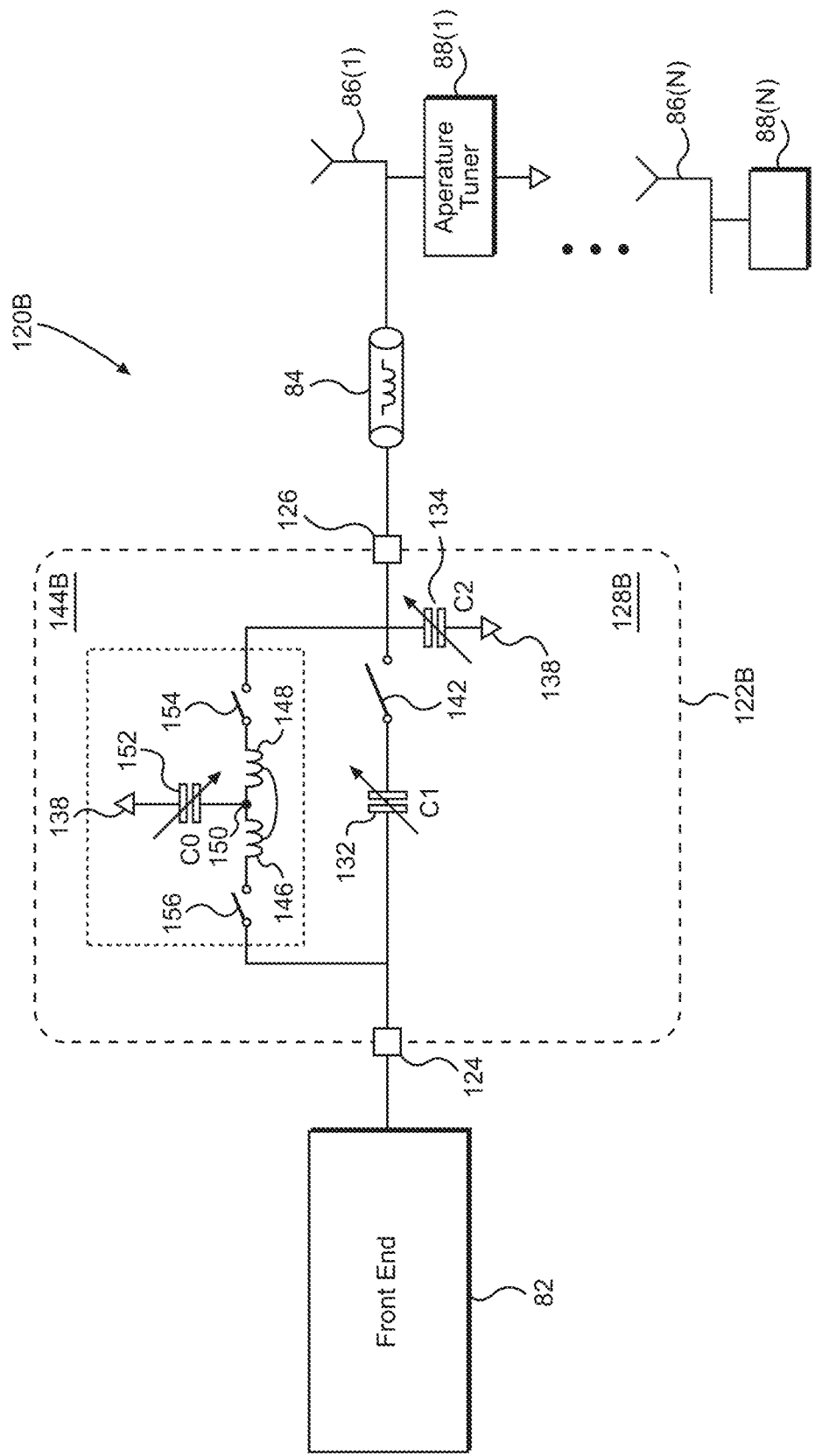
FIG. 10 is a circuit diagram of the combined impedance tuner and adjustable rejection circuit with two additional switches to disconnect the adjustable rejection circuit as well as remove any impedance that might exist as a function of a connection to ground therethrough.

FIG. 10 illustrates mobile communication device 120B that includes a front end 82, a connector 84, antennas 86(1)-86(N), and aperture tuners 88(1)-88(N). The mobile communication device 120B further includes a combined circuit 122B, which has been modified further by adding a second switch 156 so that not only may the adjustable rejection circuit 144B be used selectively, any impedance changes by the variable capacitor 152 coupling to ground 138 are also reduced or eliminated. Note further that the presence of the inductors 146, 148 also allow the inductor 130 with the switches 136, 140 to be eliminated as well.

Figure 11A:
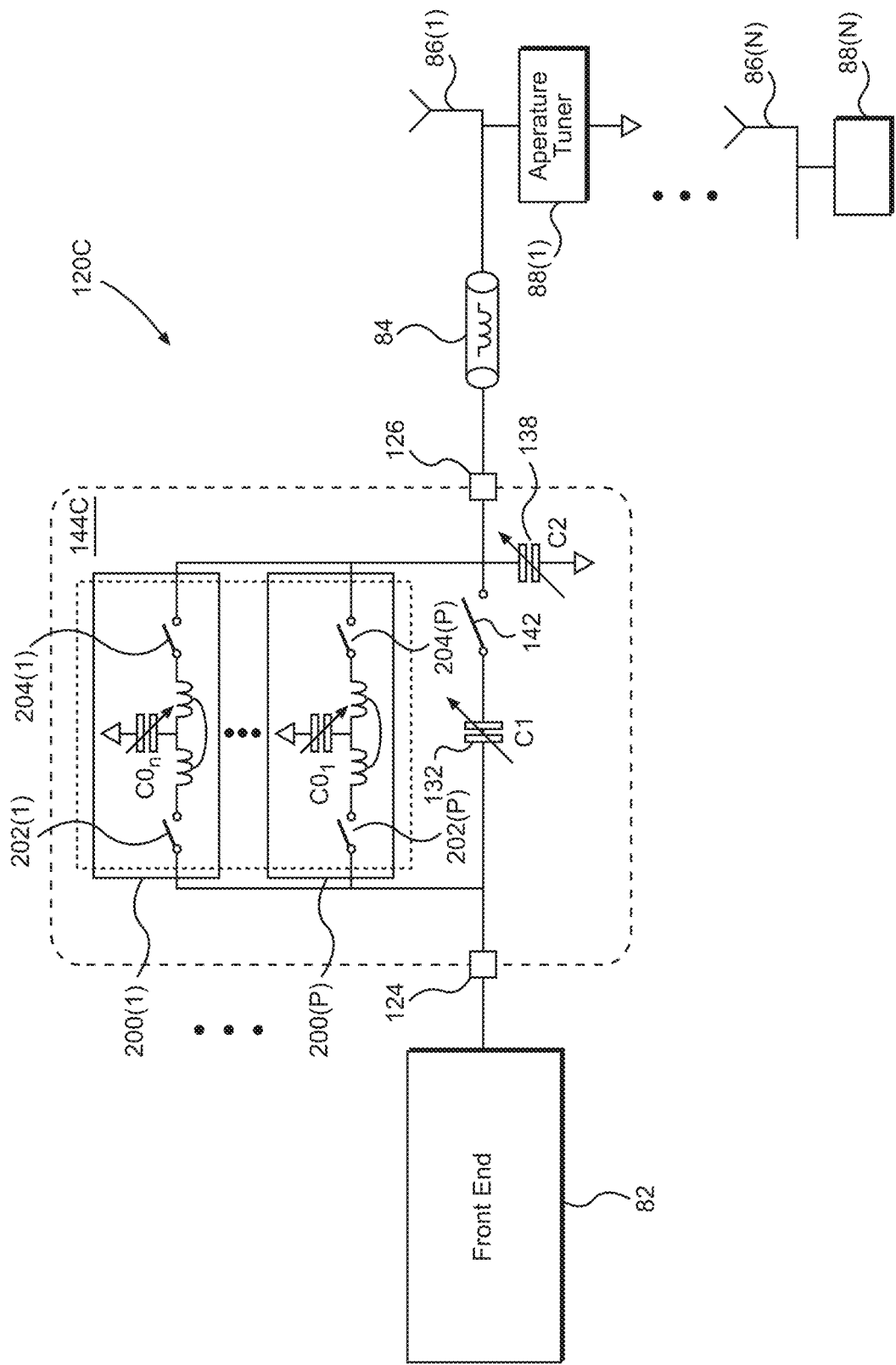
FIGS. 11A and 11B are circuit diagrams of the combined impedance tuner and adjustable rejection circuit with a plurality of adjustable rejection circuits that that may be selectively used as needed.

There are additional variations that may also be used depending on design constraints. For example, as illustrated by mobile communication device 120C in FIG. 11A, the combined circuit 144C may include a plurality of negative capacitance circuits 200(1)-200(P), which may be selected by switches 202(1)-202(P) and 204(1)-204(P). As explained above, the negative capacitance circuits 200(1)-200(P) may be formed from two negatively coupled inductors and a shunt variable capacitor coupled to the intermediate node.

Figure 11B:
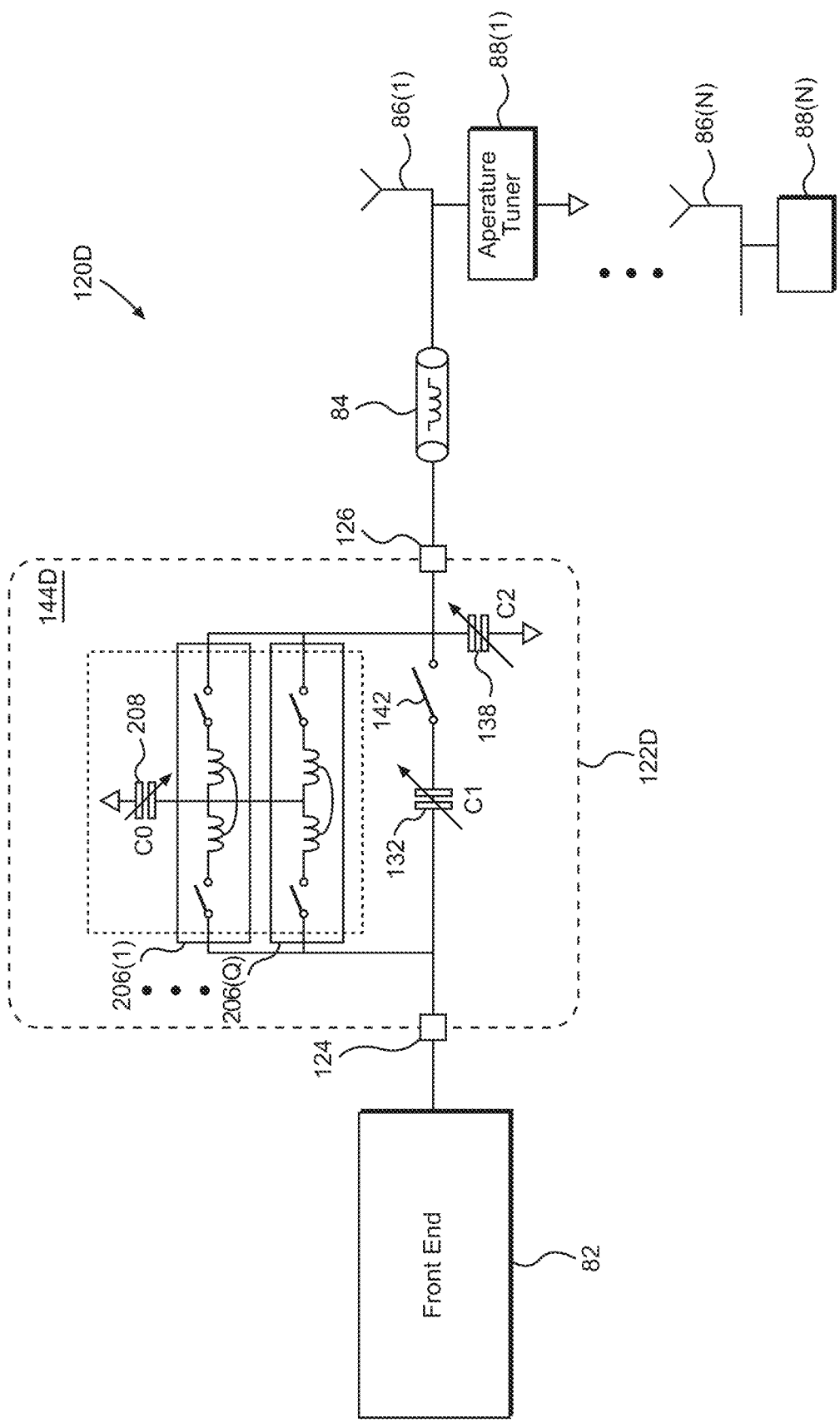

Alternatively, as illustrated in FIG. 11B, a mobile communication device 120D may include a combined circuit 144D which also includes a plurality of negative capacitive circuits 206(1)-206(Q), but instead of each circuit 206(1)-206(Q) having a respective tunable shunt capacitor, all the circuits 206(1)-206(Q) share a single shunt variable capacitor 208.

Figure 12A:
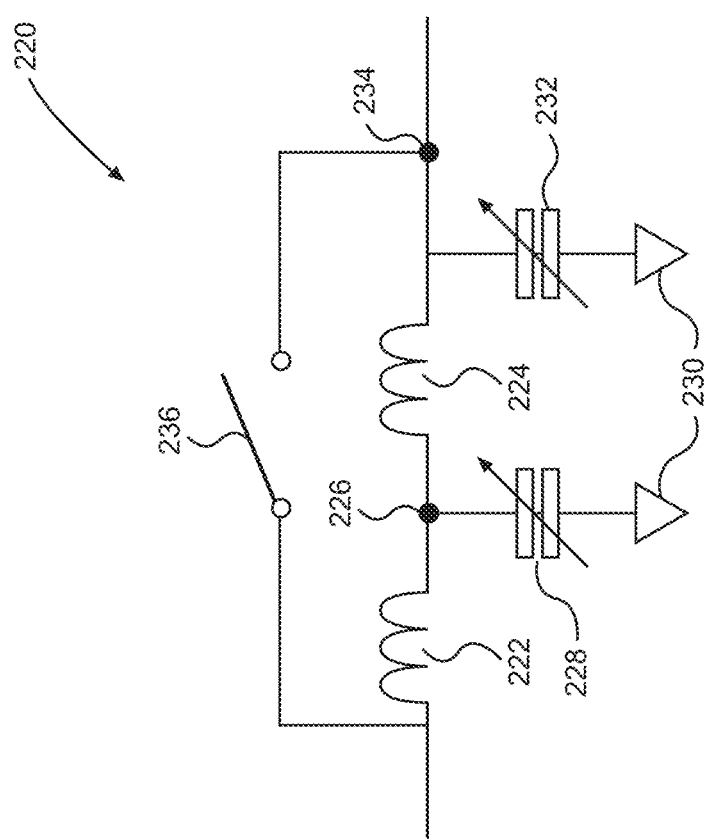
FIG. 12A is a circuit diagram of an alternate conventional impedance matching circuit.

While the two capacitor structure for the impedance matching circuit is common, such structure is not the only option for an impedance matching circuit. In this regard, FIG. 12A illustrates an impedance matching circuit 220 that includes a first inductor 222 serially connected to a second inductor 224 with an intermediate node 226 therebetween. A first variable capacitor 228 couples the intermediate node 226 to a ground 230. A second variable capacitor 232 couples a second node 234 to ground 230 as well. A bypass switch 236 may exist to bypass the elements of the impedance matching circuit 220.

Figure 12B:
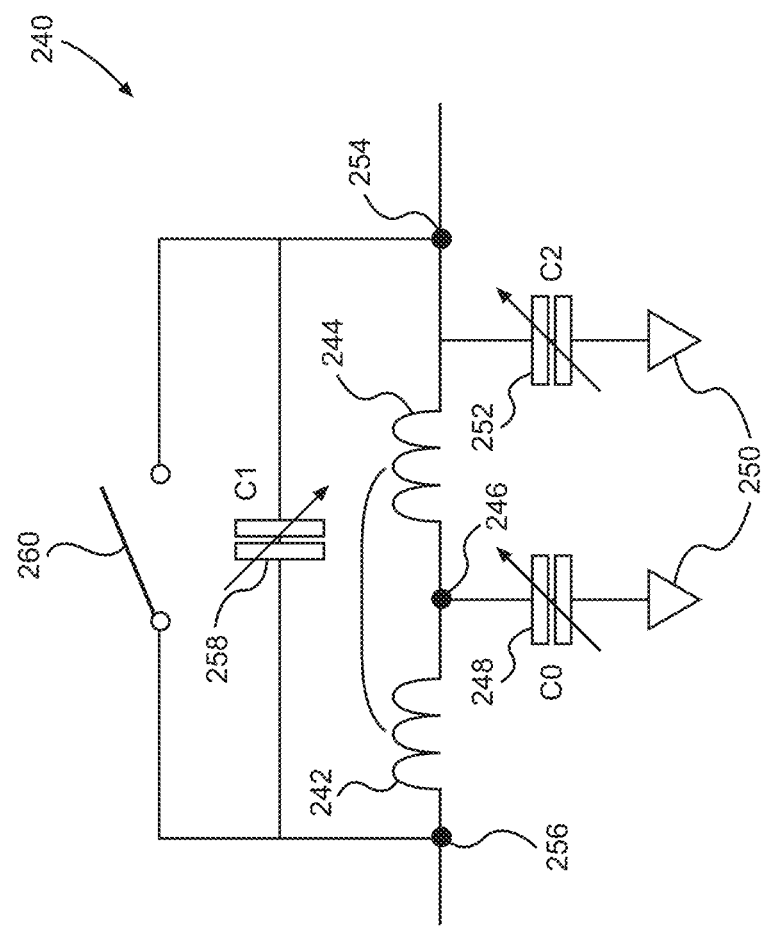
FIG. 12B is a circuit diagram of the combined impedance tuner and adjustable rejection circuit using the impedance matching circuit of FIG. 12A.

To add an adjustable rejection circuit, the impedance matching circuit 220 is modified as illustrated by a combined circuit 240 in FIG. 12B. The combined circuit 240 includes a first inductor 242 serially connected and negatively coupled to a second inductor 244 with an intermediate node 246 therebetween. A first variable capacitor 248 couples the intermediate node 246 to a ground 250. A second variable capacitor 252 couples a second node (also an output) 254 to the ground 250 as well. The first inductor 242 is also coupled to an input 256. A variable capacitor 258 is electrically parallel to the inductors 242, 244 and thus extends from the input 256 to the output 254. A switch 260 may be included to bypass the combined circuit 240.

Figure 13:
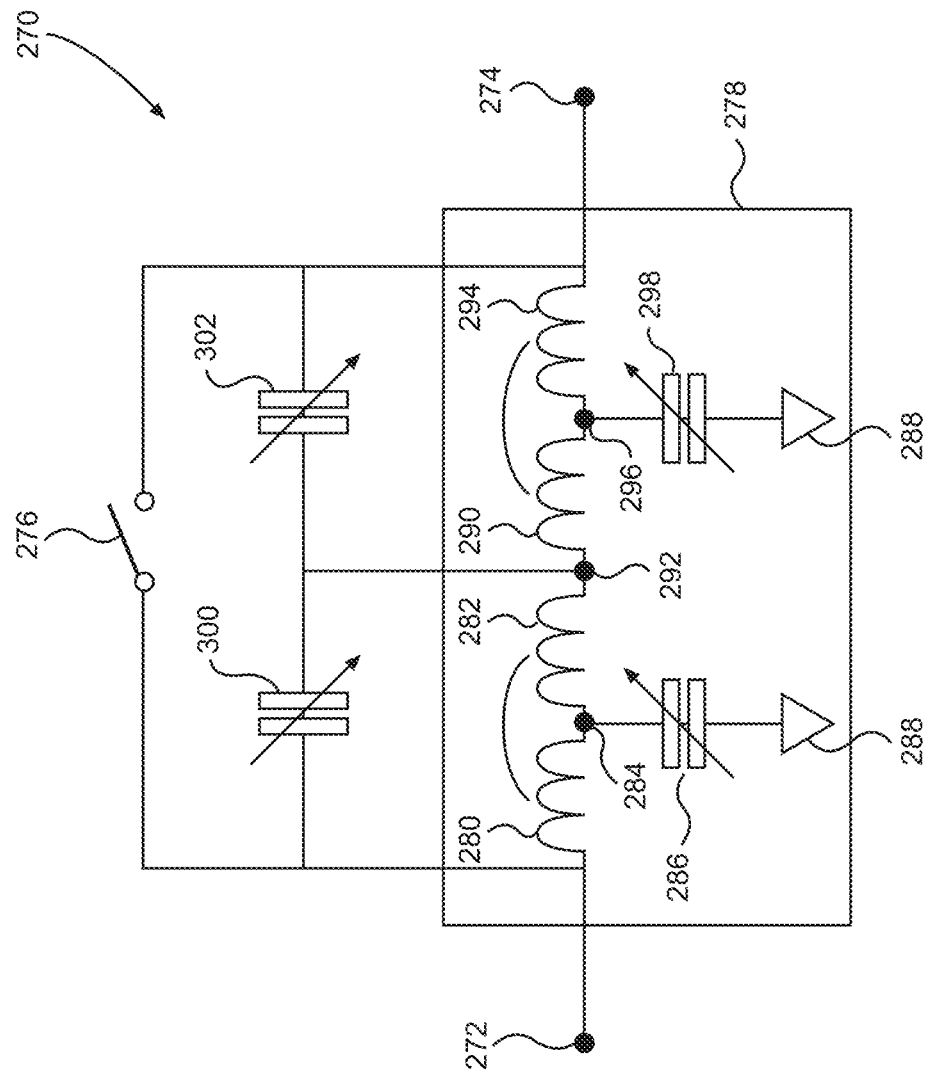
FIG. 13 is a circuit diagram of the combined impedance tuner and adjustable rejection circuit with an expanded impedance matching circuit.

FIG. 13 provides an alternate structure similar for a combined circuit 270. The combined circuit 270 includes an input 272 and an output 274. A bypass switch 276 may by be provided to create a short between the input 272 and the output 274. An impedance matching circuit 278 may include a first inductor 280 serially connected to and negatively coupled to a second inductor 282 with a first intermediate node 284 therebetween. A first variable capacitor 286 couples the first intermediate node 284 to a ground 288. Additionally, a third inductor 290 may be serially coupled to the second inductor 282 with a second intermediate node 292 therebetween. A fourth inductor 294 may be serially connected to and negatively coupled to the third inductor 290 with a third intermediate node 296 therebetween. A second variable capacitor 298 may couple the third intermediate node 296 to the ground 288.

With continued reference to FIG. 13, a third variable capacitor 300 may couple the input 272 to the second intermediate node 292, and a fourth variable capacitor 302 may couple the second intermediate node 292 to the output 274. Still other arrangements may be possible without departing from the present disclosure. However, one of the advantages of the present disclosure is that elements of the impedance tuner are reused so as to minimize or at least reduce undesirable changes to the space required for the circuit.

Figure 14:
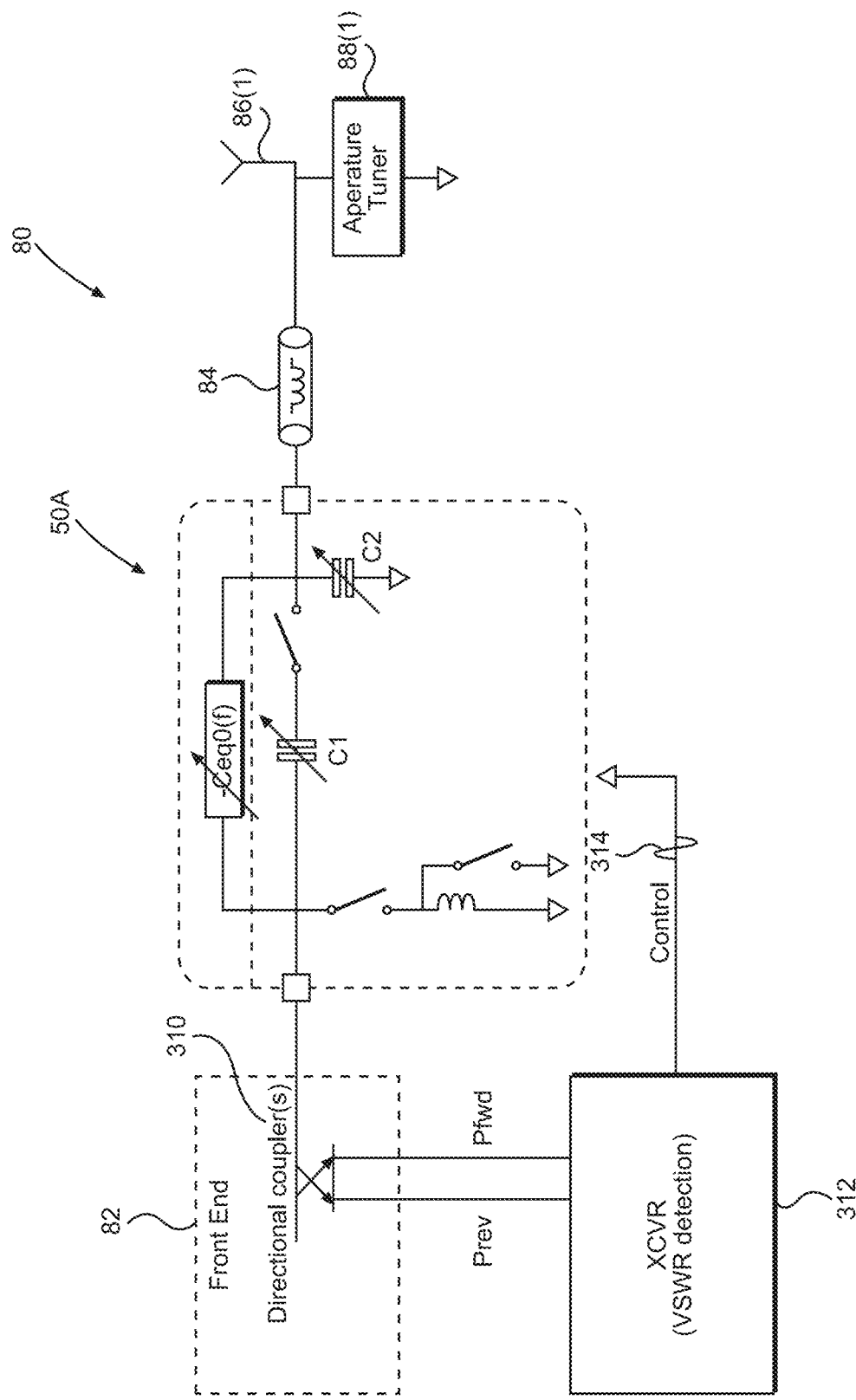
FIG. 14 is a block diagram of a mobile communication device showing the control link between a transceiver and a combined circuit according to an exemplary aspect of the present disclosure.
Figure 15:
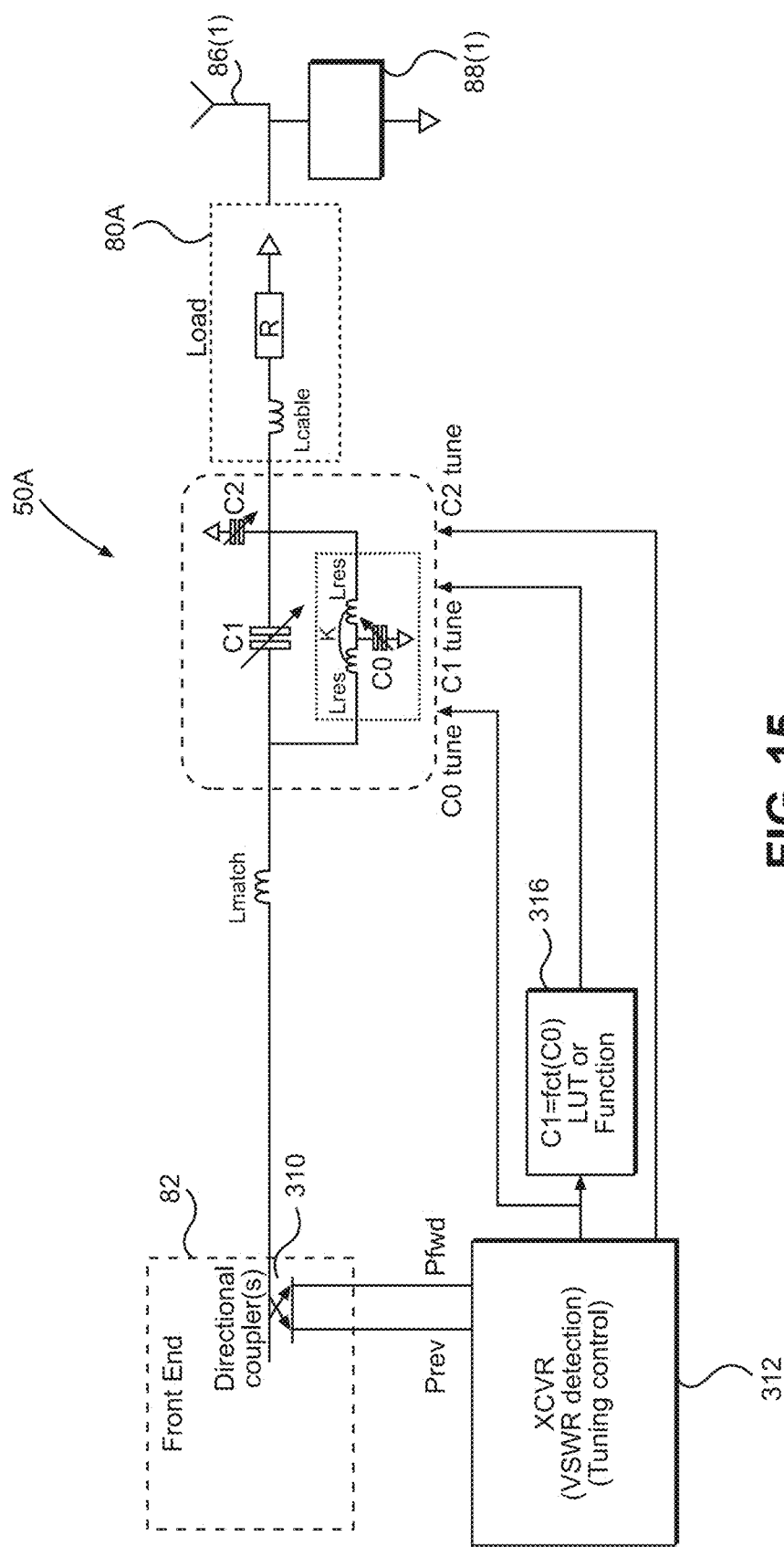
FIG. 15 is a block diagram of a mobile communication device showing the control link between a transceiver and a combined circuit according to an exemplary aspect of the present disclosure.

While the above discussion focuses on various possible circuits, FIGS. 14 and 15 show two possible control configurations for the combined circuit 50A of FIG. 4. In particular, in FIG. 14 the front end 82 may include a directional coupler 310, which provides power measurements for forward (Pfor) and reverse directions (Prev), which are used by a transceiver 312 to calculate a voltage standing wave ratio (VSWR) and generate a control signal 314 which adjusts the variable elements within the combined circuit 50A. Note that a control link already exists to change elements of the impedance matching portion of the combined circuit 50A, so no additional paths need be created. Similarly, in FIG. 15, a control signal may be sent from the transceiver 312 to a look-up table (LUT) 316 or other circuit that generates the command for a variable capacitor (e.g., C1) as a function of the command signal for the negative capacitive element (C0). While not illustrated, the LUT 316 or function could work the other way. That is, the LUT 316 receives the command for the C1 capacitive element and generates the command for C0 capacitive element.

Figure 16:
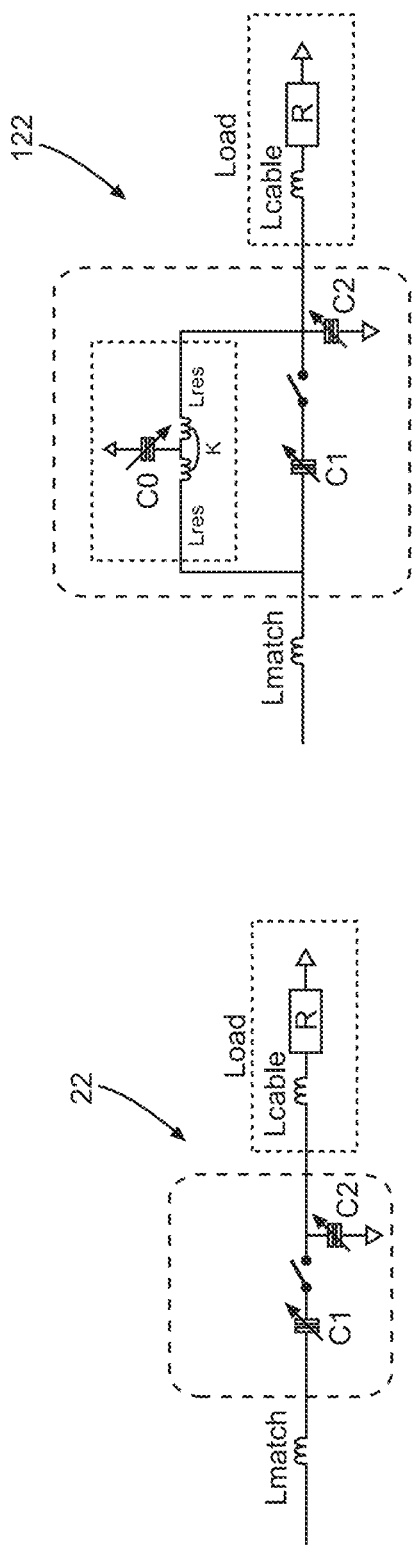
FIG. 16 illustrates graphs of comparative outputs from a simulation between a conventional impedance matching circuit and a combined circuit according to an exemplary aspect of the present disclosure.
Figure 16:
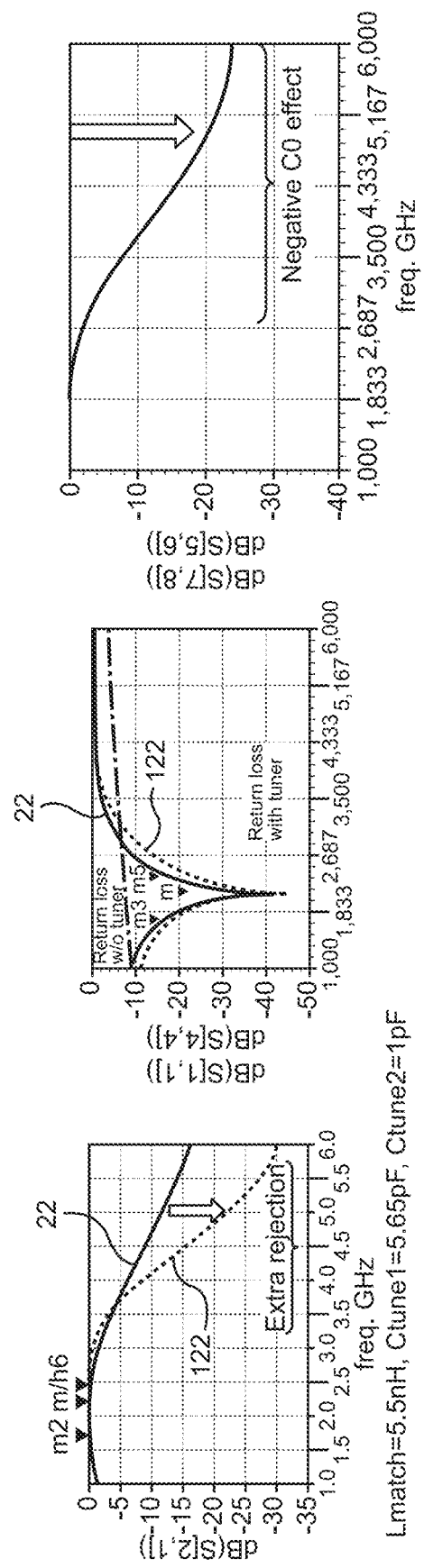

Simulations show that exemplary aspects of the present disclosure provide substantially improved rejection without materially affecting the impedance matching as shown in FIG. 16. Specifically, rejection and return loss are graphed for the impedance tuner 22 and the combined circuit 122. The solid line corresponds to the return loss and rejection for the impedance tuner 22 and the dashed line corresponds to the return loss and rejection for the combined circuit 122.

While various materials may be used in the fabrication of exemplary aspects of the present disclosure, two specifically contemplated structures would be fabricating using a silicon on insulator (SOI) material or using microelectromechanical systems (MEMS).

Those skilled in the art will recognize improvements and modifications to the embodiments of the present disclosure. All such improvements and modifications are considered within the scope of the concepts disclosed herein and the claims that follow.

What is claimed is:

1. A circuit comprising:
   an input;
   an output;
   an impedance tuner comprising:
      a first variable capacitor having a first end and a second end, the first variable capacitor serially positioned between the input and the output; and
      a second variable capacitor coupled to a first node formed by the second end of the first variable capacitor and the output, the second variable capacitor also coupled to a ground; and
   an adjustable rejection circuit comprising:
      a variable negative capacitance circuit electrically parallel to the first variable capacitor.

2. The circuit of claim 1, wherein the impedance tuner further comprises an inductor coupled at a first end to the input and the first end of the first variable capacitor and coupled at a second end to the ground.

3. The circuit of claim 1, wherein the variable negative capacitance circuit comprises a first inductor and a second inductor negatively serially coupled to the first inductor.

4. The circuit of claim 3, wherein the adjustable rejection circuit further comprises a third variable capacitor coupled to an intermediate node between the first inductor and the second inductor and also coupled to the ground.

5. The circuit of claim 3, further comprising a switch between the second inductor and the first node.

6. The circuit of claim 3, further comprising a first switch positioned before the first inductor and a second switch positioned between the second inductor and the first node.

7. The circuit of claim 3, further comprising a third inductor serially coupled to a fourth inductor, the third and fourth inductors electrically parallel to the first and second inductors.

8. The circuit of claim 7, further comprising a third variable capacitor coupled to an intermediate node between the third and fourth inductors.

9. The circuit of claim 8, wherein the third variable capacitor is also coupled to a second intermediate node between the first and second inductors.

10. The circuit of claim 1 fabricated on a silicon on insulator (SOI) material.

11. The circuit of claim 1 fabricated with microelectromechanical systems (MEMS) technology.

12. A circuit comprising:
an input;
an output;
an impedance tuner comprising:
  a first inductor coupled to the input;
  a second inductor serially negatively coupled to the input and the output;
  a first variable capacitor coupled to an intermediate node between the first inductor and the second inductor and also coupled to a ground; and
  a second variable capacitor coupled to the output; and
an adjustable rejection circuit comprising:
  a variable negative capacitance circuit electrically parallel to the impedance tuner.

13. The circuit of claim 12, further comprising a bypass switch electrically in parallel to the adjustable rejection circuit.

14. The circuit of claim 12, wherein the impedance tuner comprises a third and fourth inductor serially coupled to the second inductor.

* * * * *